United States Patent
Koo et al.

(10) Patent No.: US 7,675,103 B2
(45) Date of Patent: Mar. 9, 2010

(54) SPIN TRANSISTOR USING FERROMAGNET

(75) Inventors: Hyun-Cheol Koo, Seoul (KR); Suk-Hee Han, Seoul (KR); Jong-Hwa Eom, Seoul (KR); Joon-Yeon Chang, Seoul (KR); Hyung-Jun Kim, Daeku (KR); Hyun-Jung Yi, Seoul (KR)

(73) Assignee: Korea Institute of Science and Technology (KR)

( * ) Notice: Subject to any disclaimer, the term of this patent is extended or adjusted under 35 U.S.C. 154(b) by 22 days.

(21) Appl. No.: 12/281,143

(22) PCT Filed: Oct. 30, 2006

(86) PCT No.: PCT/KR2006/004462

§ 371 (c)(1),
(2), (4) Date: Aug. 28, 2008

(87) PCT Pub. No.: WO2007/148854

PCT Pub. Date: Dec. 27, 2007

(65) Prior Publication Data

US 2009/0008689 A1    Jan. 8, 2009

(30) Foreign Application Priority Data

Jun. 23, 2006   (KR)  .................... 10-2006-0057043

(51) Int. Cl.
*H01L 29/00* (2006.01)

(52) U.S. Cl. .............................. 257/295; 257/E29.001; 257/E49.003; 438/213

(58) Field of Classification Search ................ 257/295, 257/192, 421, 288, 902, E29.001, E29.164, 257/E29.253, E29.167, E29.039, E29.242, 257/E43.001, E49.003; 438/3, 213; 977/933
See application file for complete search history.

(56) References Cited

U.S. PATENT DOCUMENTS 5,654,566 A    8/1997    Johnson (Continued)

FOREIGN PATENT DOCUMENTS

JP    2000349095 A    12/2000

(Continued)

OTHER PUBLICATIONS

Supriyo Datta et al., "Electronic analog of the electro-optic modulator", Appl. Phys. Lett., 56 (7), Feb. 12, 1990, p. 665-667.

(Continued)

*Primary Examiner*—Victor A Mandala
*Assistant Examiner*—Whitney Moore
(74) *Attorney, Agent, or Firm*—Wells St. John P.S.

(57) ABSTRACT

A spin transistor comprises a semiconductor substrate part having a lower cladding layer, a channel layer and an upper cladding layer sequentially stacked therein, a ferromagnetic source and drain on the substrate part, and a gate on the substrate part to control spins of electrons passing through the channel layer. The lower cladding layer comprises a first lower cladding layer and a second lower cladding layer having a higher band gap than that of the first lower cladding layer. The upper cladding layer comprises a first upper cladding layer and a second upper cladding layer having a higher band gap than that of the first upper cladding layer. The source and the drain are buried in an upper surface of the substrate part and extend downwardly to or under the first upper cladding layer.

16 Claims, 17 Drawing Sheets

U.S. PATENT DOCUMENTS

2007/0059877 A1* 3/2007 Koo et al. .................. 438/213

FOREIGN PATENT DOCUMENTS

| JP | 2003092412 A | 3/2003 |
|----|--------------|--------|
| JP | 2006032915 A | 2/2006 |
| KR | 1998044520 A | 9/1998 |

OTHER PUBLICATIONS

P.R. Hammar et al., "Detection of Spin-Polarized Electrons Injected into a Two-Dimensional Electron Gas", Physical Review Letters, vol. 88, No. 6, Feb. 11, 2002, 4 pages.

* cited by examiner (a)

(b)

SPIN TRANSISTOR USING FERROMAGNET

RELATED PATENT DATA

This application claims priority to Patent Cooperation Treaty application Serial No. PCT/KR2006/004462, which was filed Oct. 30, 2006, and which claims priority to Korean Application Serial No. 10-2006-0057043, which was filed Jun. 23, 2006.

TECHNICAL FIELD

The present invention generally relates to a spin transistor comprising a ferromagnetic source and drain, and, more particularly, to a spin transistor, which shows clear spin transport from a ferromagnet to a semiconductor and an improved signal-to-noise ratio.

BACKGROUND ART

Recently, a spin transistor such as Spin-FET (field effect transistor) has been spotlighted under active investigation as a new concept transistor. A conventional semiconductor-based transistor (for example, MOSFET) controls charges in the semiconductor by use of an electric field, whereas the spin transistor simultaneously controls both charges and spins by use of spin-polarized charges. Today's investigations try to apply the spin transistor to switching devices or logic circuits through control of the spin-polarized charges. Capability of the spin transistor depends on efficiency of injecting spin-polarized electrons from a ferromagnet to a semiconductor without noise. Various investigations have been undertaken in relation to semiconductor materials or metallic materials to improve a spin injection technique.

Currently, MOSFET, one of the most important elements of a semiconductor device, is confronted with problems including difficulty in additional reduction of power and area, and a physical limit of an oxide film thereof. As one of approaches to overcome these problems, devices capable of controlling precession of the spins with voltage have been variously investigated since they were suggested in 1990's. Among these devices, the spin transistor comprises a source, a drain, and a channel to connect the source and the drain. The channel of the spin transistor can be a quantum well layer of high electron mobility, particularly a two-dimensional electron gas (2-DEG) layer. Such a spin transistor is a Datta-Das Spin FET (see "Applied Physics Letter," Vol. 56, p. 665, 1990), and a spin transistor disclosed in U.S. Pat. No. 5,654,566 entitled "Magnetic spin injection field effect transistor and method of operation." Meanwhile, an investigation related to spin injection from the ferromagnet into two-dimensional electron gas layer required to realize the spin transistor is reported by Hammer, et al. (see "Physical Review Letters," Vol. 88, p. 066806, 2002). According to this investigation, the spin transistor has problems of substantial noise and very low injection efficiency. The high noise and very low injection efficiency is mainly caused by mismatch of conductivity between the metallic ferromagnet and the semiconductor, and by noise from a non-uniform junction therebetween.

FIGS. 1(a) and 1(b) are a top view and a cross-sectional view of a conventional spin transistor. Referring to FIGS. 1(a) and 1(b), a spin transistor 50 comprises a substrate part 10, a ferromagnetic source and drain 13 and 14 on the substrate part 10, and a gate 17. The gate 17 is insulated from the source 13, drain 14 and substrate part 10 by a gate oxide. The substrate part 10 is formed of a semiconductor material, and comprises a channel layer 7 which constitutes a two-dimensional electron gas layer. Spins of electrons injected from the source 13 into the channel layer 7 are controlled via a gate voltage. The electron spins reaching the drain 14 have a direction parallel or anti-parallel to a magnetization direction of the drain 14 so that resistance of the spin transistor is controlled.

FIG. 2 is a cross-sectional view taken along line AB of FIG. 1. Referring to FIG. 2, the substrate part 10 comprises a buffer layer 2, a carrier supply layer 4, a lower cladding layer 5, the channel layer 7, an upper cladding layer 5', and a capping layer 6 sequentially stacked on a semi-insulating InP substrate 1. The channel layer 7 is constituted by an InAs quantum well layer. The lower cladding layer 5 comprises InGaAs and InAlAs layers 5a and 5b, and the upper cladding layer 5' comprises InAlAs and InGaAs layers 5b' and 5a'. Thus, both of the upper and lower cladding layers 5' and 5 have a double cladding structure which has different energy band gaps. FIG. 2 shows an example of materials used for the respective layers.

FIG. 3 shows an energy-band structure at a junction between the source or drain 13 or 14 and the substrate part 10 in the spin transistor of FIG. 1. Referring to FIG. 3, the InGaAs 5a or 5a' and the InAlAs 5b or 5b' serve as energy barriers to constrain electrons within the InAs channel layer 7. In order to allow the spin electrons to be injected from the ferromagnetic source 13 into the channel layer 7, it is necessary for the spin electrons to surmount the energy barriers, that is, 5a' and 5b'. If the channel layer is in direct contact with the ferromagnet (source) without the energy barriers, injected polarization is lowered due to influence of minor spins and back-scattering. For this reason, the energy barrier is introduced between the layers. In addition, it is necessary to form a cladding barrier surrounding the channel for easy achievement of the Rashba effect through gate control.

However, the energy barriers 5a' and 5b' of the double cladding structure cause an increase in contact resistance. Accordingly, the transistor suffers from deterioration in signal sensitivity, increase in power consumption, and reduction in signal-to-noise ratio. As a result, it is difficult to stably obtain clear signals from the spin transistor 50.

DISCLOSURE OF INVENTION

Technical Problem

The present invention has been made in view of the above problems, and it is an object of the present invention to provide a high quality spin transistor, which shows clear spin transport and an improved signal-to-noise ratio.

Technical Solution

In accordance with one aspect of the present invention, the above and other objects can be accomplished by the provision of a spin transistor, comprising: a semiconductor substrate part having a lower cladding layer, a channel layer, and an upper cladding layer sequentially stacked therein a ferromagnetic source and drain spaced from each other on the substrate part and a gate formed on the substrate part to control spins of electrons passing through the channel layer, wherein the lower cladding layer comprises a first lower cladding layer and a second lower cladding layer formed under the first lower cladding layer and having a higher band gap than that of the first lower cladding layer, wherein the upper cladding layer comprises a first upper cladding layer and a second upper cladding layer formed on the first upper cladding layer and having a higher band gap than that of the first upper cladding layer, and wherein the source and the drain are buried in an upper surface of the substrate part and extend downwardly to or under the first upper cladding layer.

According to one embodiment, the source and the drain may have lower surfaces extending to the first upper cladding layer. In this case, the source and the drain are buried in the upper surface of the substrate part while extending to a predetermined thickness of the first upper cladding layer.

According to another embodiment, the source and the drain may have lower surfaces extending to the channel layer. In this case, the source and the drain are buried in the upper surface of the substrate part while extending to a predetermined thickness of the channel layer.

According to yet another embodiment, the source and the drain may have lower surfaces extending to the lower cladding layer. In this case, the source and the drain are buried in the upper surface of the substrate part while extending to a predetermined thickness of the lower cladding layer.

Preferably, the channel layer comprises a two-dimensional electron gas layer. In the two-dimensional electron gas layer, not only electron mobility is very high, but also spin-orbit coupling effect is great. The two-dimensional electron gas layer may be formed of a material selected from the group consisting of GaAs, InAs, InGaAs and InSb.

According to one embodiment, the source and the drain may be a ferromagnetic metal. For example, the source and the drain may be formed of a material selected from the group consisting of Fe, Co, Ni, CoFe, NiFe and combination thereof.

According to another embodiment, the source and the drain may be a ferromagnetic semiconductor. For example, the source and the drain may be formed of one of (GaMn)As and (InMn)As.

According to the embodiment, the substrate part may further comprise a carrier supply layer formed under the lower cladding layer. The substrate part may further comprise a capping layer formed on the upper cladding layer. The carrier supply layer may be formed of InAlAs, and the capping layer may be formed of InAs.

According to the embodiment, the first lower cladding layer and the first upper cladding layer may be formed of un-doped InGaAs, and the second lower cladding layer and the second upper cladding layer may be formed of un-doped InAlAs.

According to the embodiment, the spin transistor may further comprise a natural oxide film at an interface between the substrate part and the lower surface of each of the source and the drain.

According to the present invention, the ferromagnetic source and drain are buried in the upper surface of the substrate part, and extend to or under the first upper cladding layer. Thus, it is not necessary for the electrons injected from the ferromagnetic source to surmount the energy barrier of the second upper cladding layer. In addition, the energy barrier between the source and the channel is reduced in thickness. As a result, the contact resistance therebetween is reduced, and the spin transport signal is improved.

ADVANTAGEOUS EFFECTS

As apparent from the above description, according to the present invention, the ferromagnetic source and drain extend downwardly to or under a first upper cladding layer, making it easier for electrons injected from the ferromagnetic source to surmount an energy barrier. In other words, an energy barrier between the source and the channel is reduced in thickness. With this structure, the spin transistor has significantly reduced contact resistance, noticeably clear spin transport signal, and an improved signal-to-noise ratio. As a result, the spin transistor of the invention provides clear spin signals and a wide reading margin.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
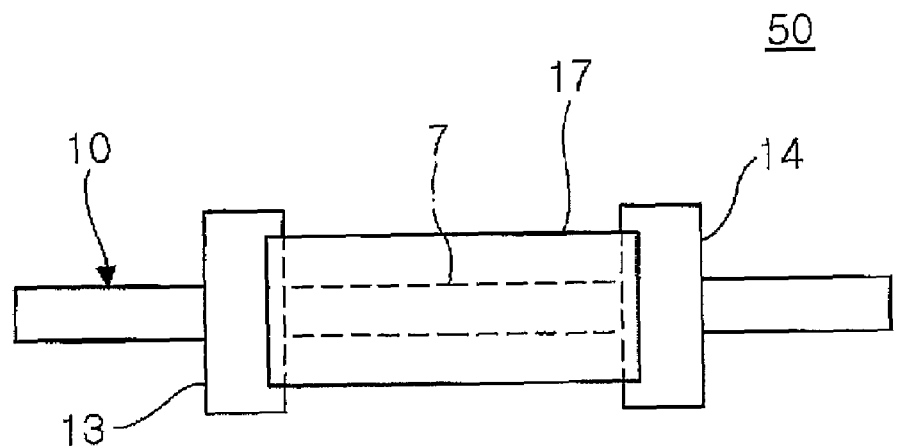
FIGS. 1(a) and 1(b) are a top view and a cross-sectional view of a conventional spin transistor.
Figure 1:
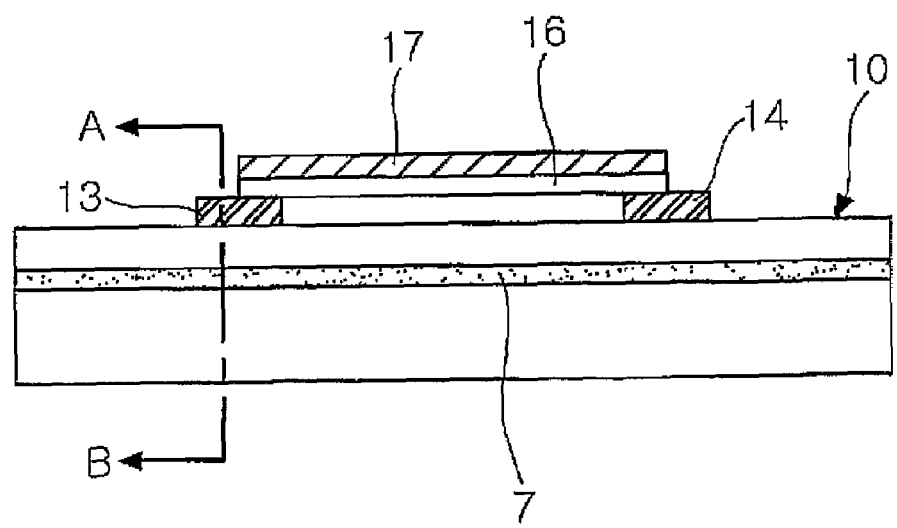

Preferred embodiments will now be described in detail with reference to the accompanying drawings. It should be noted that the embodiments of the invention can take various forms, and that the present invention is not limited to the embodiments described herein. The embodiments of the invention are described so as to enable those having an ordinary knowledge in the art to have a perfect understanding of the invention. Accordingly, shape and size of components of the invention are enlarged in the drawings for clear description of the invention. Like components are denoted by the same reference numerals throughout the drawings.

Figure 4:
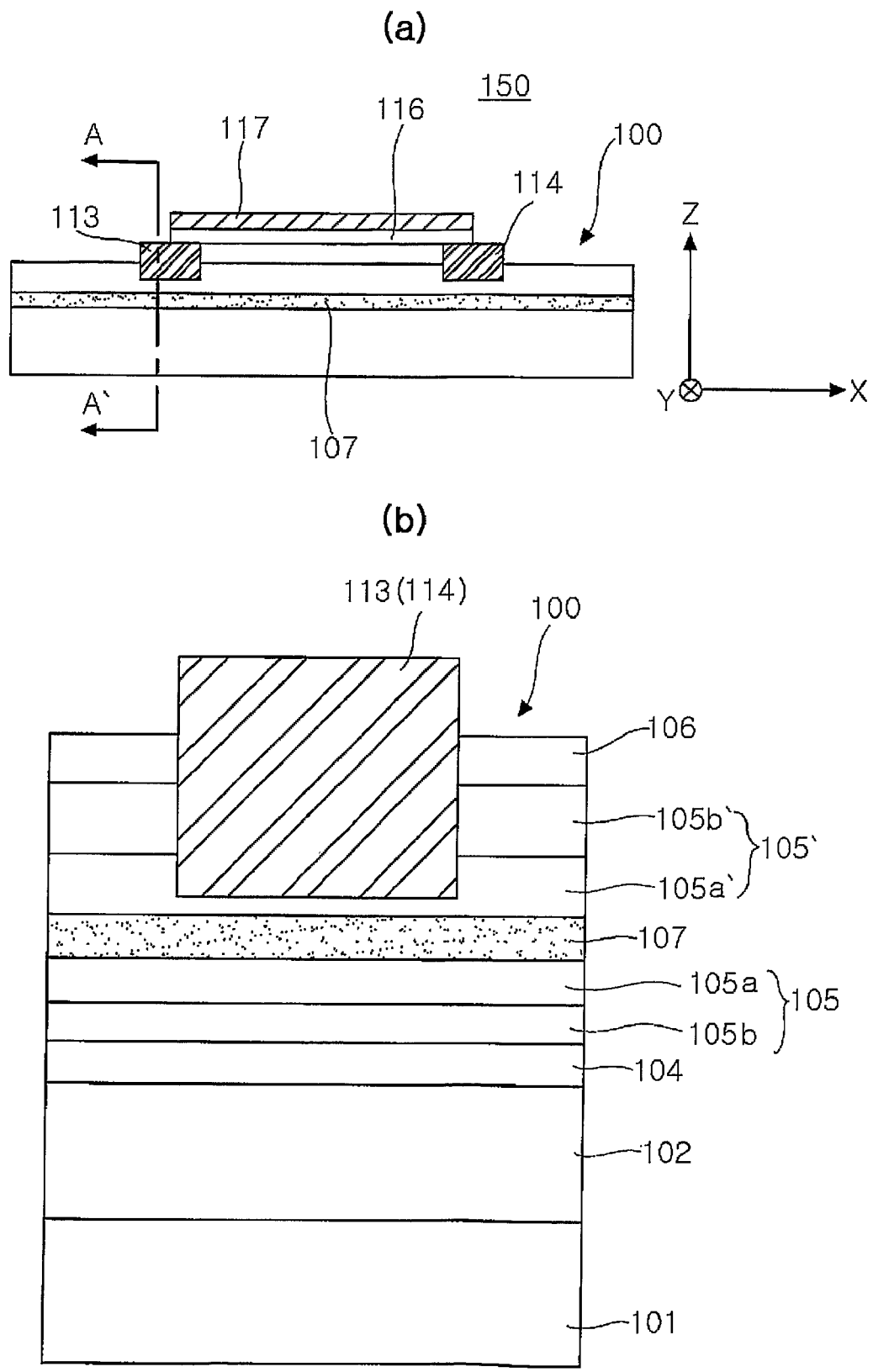
FIG. 4(a) is a cross-sectional view of a spin transistor according to one embodiment of the present invention.
FIG. 4(b) is a cross-sectional view taken along line AA' of FIG. 4(a)

FIG. 4(a) is a cross-sectional view of a spin transistor according to one embodiment of the present invention, and FIG. 4(b) is a cross-sectional view taken along line AA' of FIG. 4(a).

Referring to FIG. 4(a), a spin transistor 150 comprises a semiconductor substrate part 100 having a channel layer 107 formed therein, and a ferromagnetic source and drain 113 and 114 spaced from each other on the substrate part 100. A gate 117 is disposed between the source 113 and the drain 114 on the substrate part 100. The gate 117 is insulated from the source 113, drain 114 and substrate part 100 by a gate oxide.

During operation of the spin transistor 150, spins of electrons passing through the channel layer 107 are controlled by voltage (gate voltage) applied to the gate 117. If there exists an electric field (E) perpendicular to a wave vector (k) of the electrons passing through the channel layer 107, a magnetic field expressed by $H_{Rashba} \propto k \times E$ by spin-orbit coupling effect. This is known as the Rashba effect. That is, when electric current proceeds in a direction of x and an electric field is applied in a direction of z by the gate voltage, a magnetic field (spin-orbit coupling induced magnetic field) is induced in a direction of y by the spin-orbit coupling effect.

The spins of electrons injected into the channel layer 107 generate precession by virtue of the spin-orbit coupling induced magnetic field, if the direction of the spins is not parallel to that of the spin-orbit coupling induced magnetic field. Resistance of the spin transistor can be adjusted by controlling an angle of the precession through the gate. If the spins of the electrons reaching the drain have the same direction as that of magnetization of the drain, the spin transistor exhibits a low resistance (on-state), whereas, if the spins of the electrons reaching the drain have the opposite direction to that of magnetization of the drain, the spin transistor exhibits a high resistance (off-state).

Referring to FIG. 4(b), the substrate part 100 comprises an InAlAs buffer layer 102, an n-doped InAlAs carrier supply layer 104, an undoped InGaAs/InAlAs lower cladding layer 105, an InAs channel layer 107, an undoped InAlAs/InGaAs upper cladding layer 105' and an InAs capping layer 106. Both of the upper and lower cladding layers 105' and 105 have a double cladding structure which comprises an undoped InGaAs layer and an undoped InAlAs layer. That is, the lower cladding layer 105 comprises a first lower cladding layer 105a of InGaAs and a second lower cladding layer 105b of InAlAs formed under the first lower cladding layer 105a. In addition, the upper cladding layer 105' comprises a first upper cladding layer 105a' of InGaAs and a second upper cladding layer 105b' of InAlAs formed on the first upper cladding layer 105a'. The second upper and lower cladding layers 105b' and 105b have higher energy band gaps than those of the first upper and lower cladding layers 105a' and 105a, respectively.

The channel layer 107 forms a quantum well by virtue of the energy barriers of the upper and lower cladding layers 105 and 105'. The electrons are trapped in the channel layer 107 by the upper and lower cladding layers 105 and 105' of the double cladding layer structure, and the channel layer 107 forms the two-dimensional electron gas layer. In such a two-dimensional electron gas layer, not only the electron mobility is very high, but also the spin-orbit coupling effect is high. Although InAs is used for the channel layer in this embodiment, the present invention is not limited to this structure. Alternatively, GaAs, InGaAs or InSb may be used for the channel layer having the two-dimensional electron gas structure.

The n-doped InAlAs carrier supply layer 104 is formed below the channel layer 107 and serves to supply electric carriers to the channel layer 107, and the InAlAs buffer layer 102 is formed to relieve lattice mismatch between the InP substrate 101 and the lower cladding layer 105. In addition, the InAs capping layer 106 is formed as the uppermost layer of the substrate part 100, and serves to prevent oxidation and degeneration of the substrate part 100 which can occur during a process.

The source 113 and the drain 114 are formed of a magnetized ferromagnet. The source 113 and the drain 114 may be formed of ferromagnetic metal such as Fe, Co, Ni, CoFe, NiFe, etc. Alternatively, the source 113 and the drain 114 may be formed of ferromagnetic semiconductor such as (GaMn)As, (InMn)As, etc.

Figure 2:
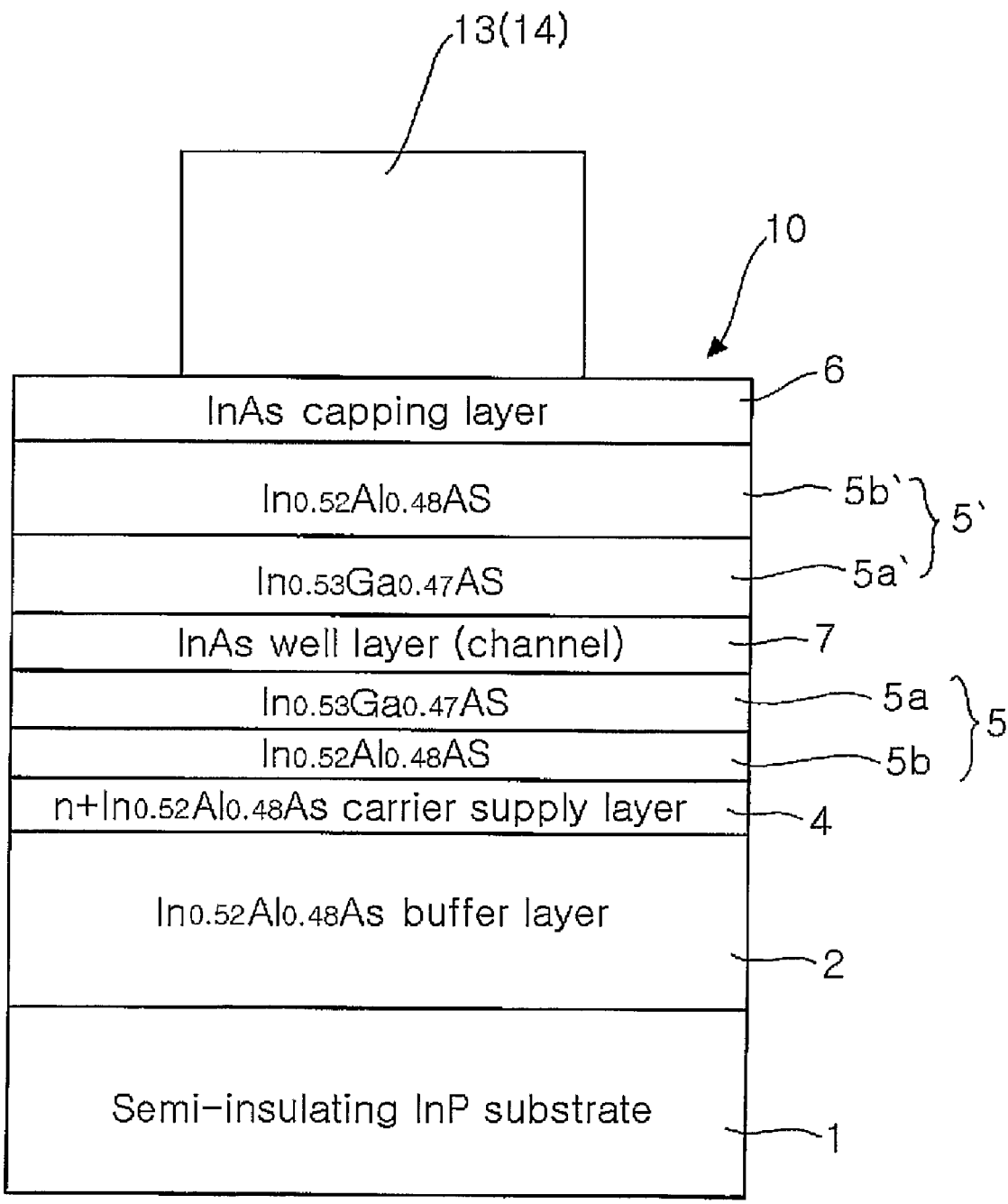
FIG. 2 is a cross-sectional view taken along line AB of FIG. 1.
Figure 3:
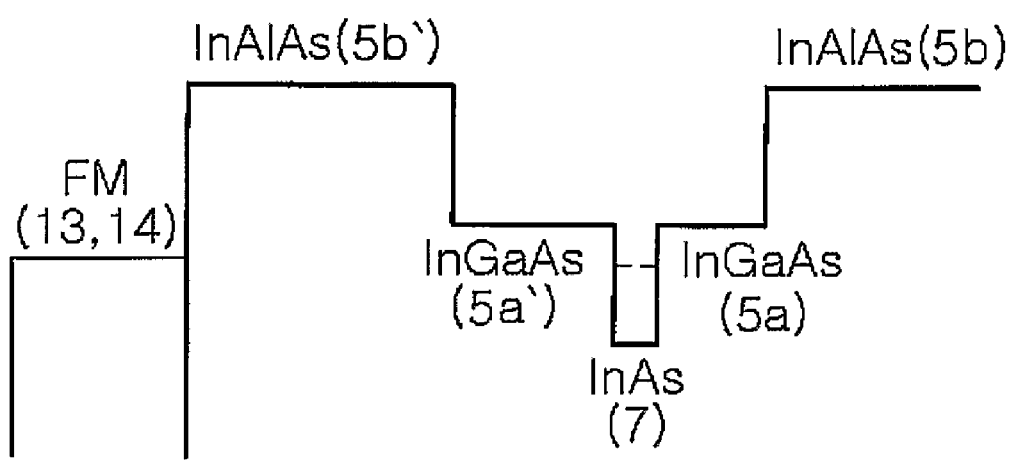
FIG. 3 shows an energy-band structure at a junction between a ferromagnet (source or drain) and a substrate part in the spin transistor shown in FIG. 1.

As shown in FIG. 4(b), the source 113 and the drain 114 are buried in an upper surface of the substrate part 100 and extend to the first upper cladding layer 105a' (comparing it with the conventional structure shown in FIG. 2). With this structure, lower surfaces of the source 113 and the drain 114 contact the first upper cladding layer 105a'. In particular, in this embodiment, the source 113 and the drain 114 are buried in the substrate part 110 and extend to a predetermined thickness of the first upper cladding layer 105a'. For ensuring current flow, the ferromagnetic source and drain 113 and 114 is in ohmic contact with the semiconductor (the upper cladding layer 105a' in this embodiment).

With the structure wherein the source 113 is buried in the upper surface of the substrate part 110 and extends to the first upper cladding layer 105a', it is not necessary for the electrons injected from the ferromagnetic source 113 to surmount the second upper cladding layer having a higher energy band gap. Additionally, the energy barrier between the source 113 and the channel layer 107 is reduced in thickness. For example, a distance between the source 113 and the channel layer 107 (that is, thickness of the energy barrier) can be maintained in the range of about 1~13 nm. Portions of the substrate part in which the ferromagnetic source and drain 113 and 114 is buried can be removed through ion-milling or dry-etching.

As such, the energy barrier for the spins of electrons injected therethrough is noticeably reduced so that the spin transistor has improved signal-to-noise ratio from the ferromagnet (source) to the semiconductor (channel layer), and reduced contact resistance therebetween. As a result, the spin transistor of the present invention can realize effective spin transfer with low noise, providing clear signals (increase in spin signal sensitivity).

Figure 5:
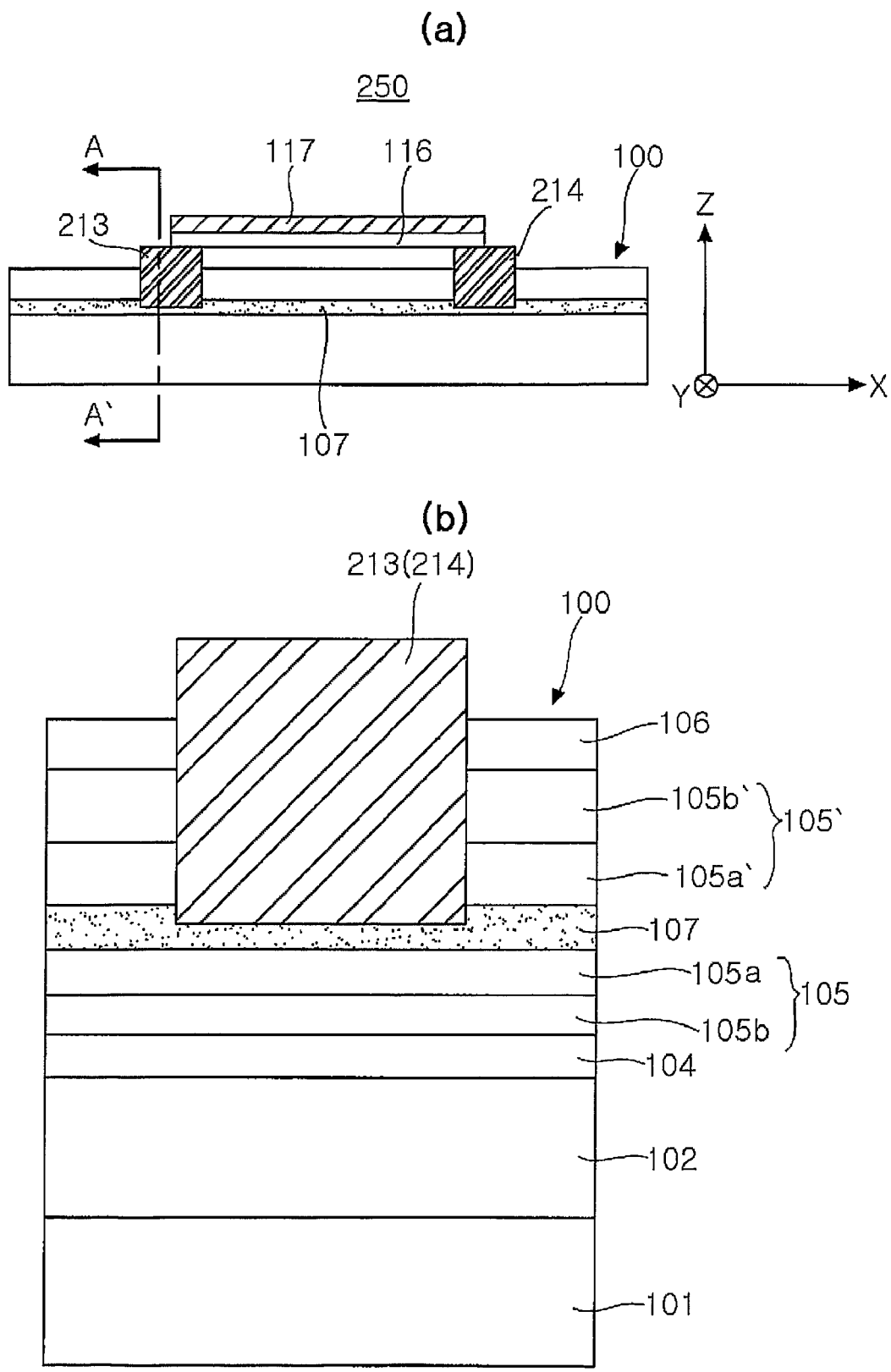
FIG. 5(a) is a cross-sectional view of a spin transistor according to another embodiment of the present invention.
FIG. 5(b) is a cross-sectional view taken along line AA' of FIG. 5(a)

FIG. 5(a) is a cross-sectional view of a spin transistor 250 according to another embodiment of the present invention, and FIG. 5(b) is a cross-sectional view taken along line AA' of FIG. 5(a). Referring to FIGS. 5(a) and 5b, a source 213 and a drain 214 are buried in an upper surface of a substrate part 100 and extend to a channel layer 107. With this structure, lower surfaces of the source 213 and the drain 214 contact the channel layer 107. In particular, the source 213 and the drain 214 are buried in the substrate part 110 and extend to a predetermined thickness of the channel layer 107.

As such, even when the ferromagnetic source 213 is in direct contact with the channel layer 107, there exists the contact resistance. However, even in this case, it is not necessary for the electrons injected from the ferromagnetic source 213 to surmount the energy barrier of the upper cladding layer having the higher energy band gap. The energy barrier for the spins of electrons injected from the ferromagnetic source 213 to the channel layer 107 is noticeably reduced so that the spin transistor has improved spin injection signal from the source 213 and improved spin signal sensitivity in the drain 214.

Figure 6:
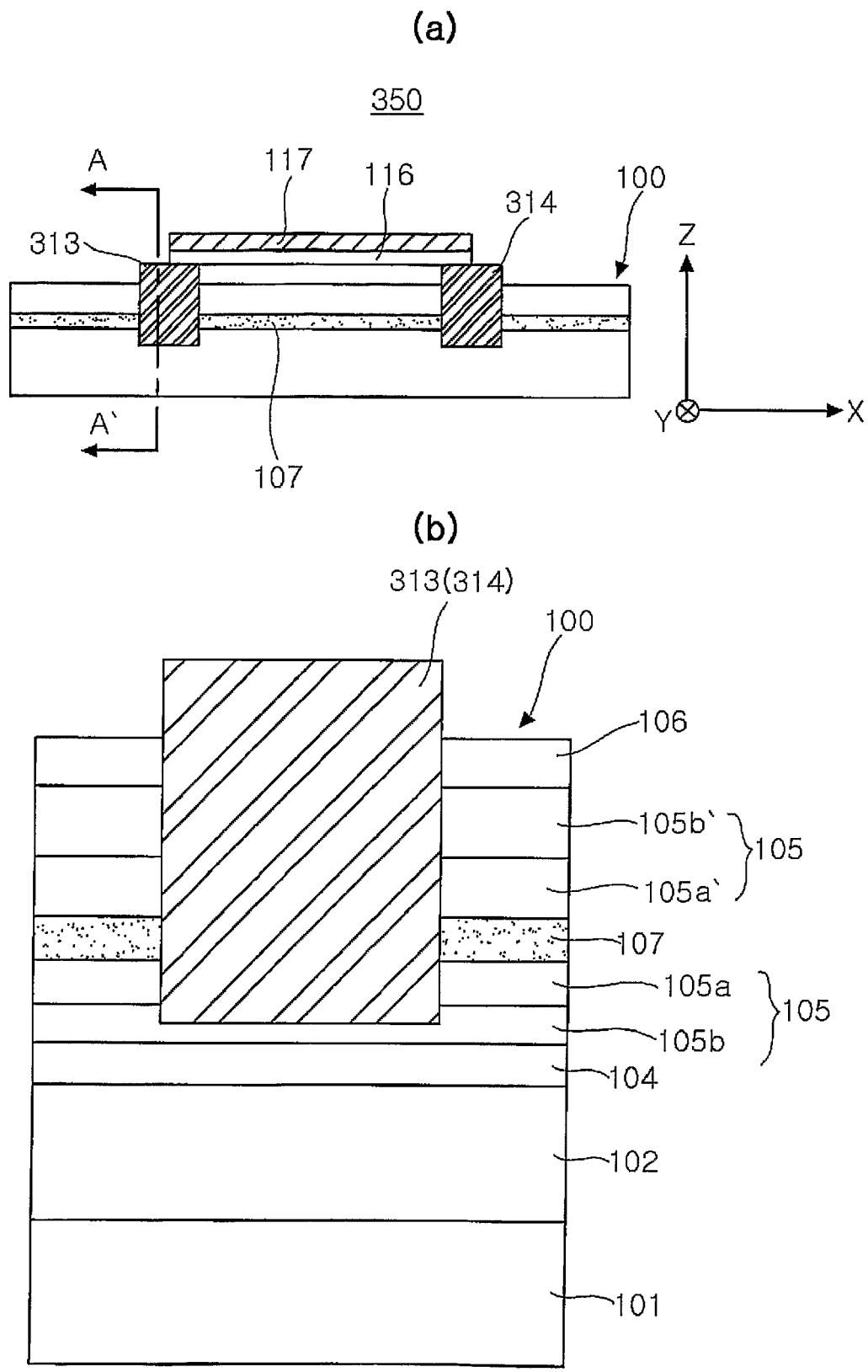
FIG. 6(a) is a cross-sectional view of a spin transistor according to yet another embodiment of the present invention.
FIG. 6(b) is a cross-sectional view taken along line AA' of FIG. 6(a)

FIG. 6(a) is a cross-sectional view of a spin transistor 350 according to yet another embodiment of the present invention, and FIG. 6(b) is across-sectional view taken along line AA' of FIG. 6(a). Referring to FIGS. 6(a) and 6(b), a source 313 and a drain 314 are buried in an upper surface of a substrate part 100 and extend to a second lower cladding layer 105b through a channel layer 107. With this structure, lower surfaces of the source 313 and the drain 314 contact the second lower cladding layer 105b. In particular, the source 313 and the drain 314 are buried in the substrate part 110 and extend to a predetermined thickness of the second lower cladding layer 105b.

As such, even when the ferromagnetic source 313 extends to the second lower cladding layer 105b, it is not necessary for the electrons injected from the source 313 to surmount the energy barrier of the upper cladding layer having the higher energy band gap as in the above embodiment. Thus, the energy barrier for the spins of electrons injected from the ferromagnetic source 213 to the channel layer 107 is noticeably reduced. As a result, the spin transistor has improved spin injection signal from the source 213 without significant noise, and improved spin signal sensitivity in the drain 314.

In the above description, although the ferromagnetic source is described as extending to the first upper cladding layer 105a', the channel layer 107 or the second lower cladding layer 105b, the present invention is not limited to this structure. For example, the ferromagnetic source may have a lower surface extending below the upper surface of the substrate part 100 to contact the first lower cladding layer 105a.

There will be described hereinafter a method for manufacturing a spin transistor according to one embodiment of the present invention with reference to FIGS. 7(a) to 7(f).

Figure 7:
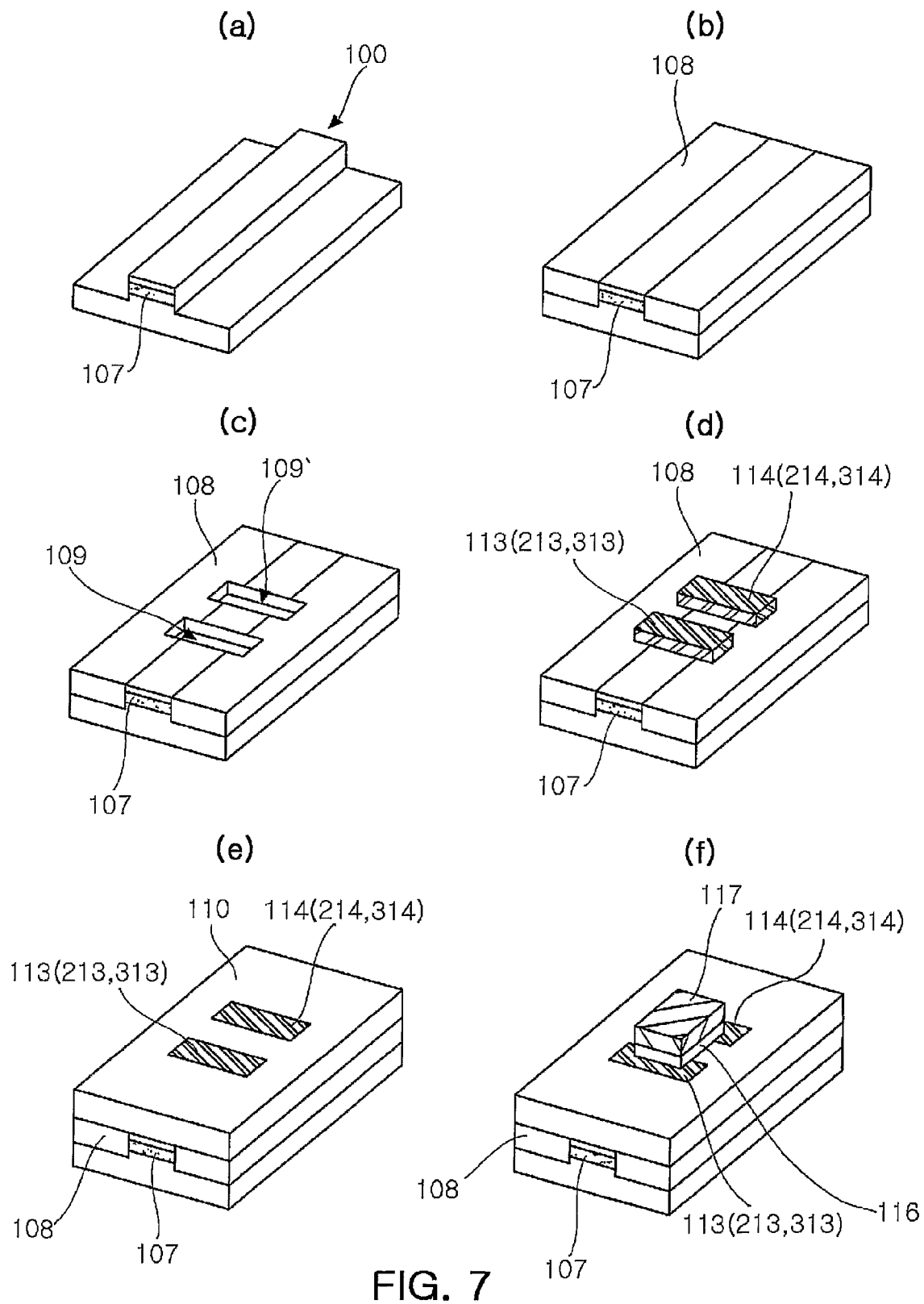
FIGS. 7(a) to 7(f) are cross-sectional views illustrating a method for manufacturing a spin transistor according to one embodiment of the present invention.

First, referring to FIG. 7(a), after forming a substrate part 100 having a multilayer structure as shown in FIG. 4(b), both sides of the substrate part 100 are removed through a lithography process and an ion-milling process, thereby forming a ridge structure on the substrate part 100. This ridge structure defines a channel layer 107 having a two-dimensional electron gas structure. The channel layer 100 may have a width of 100 nm~8 □ depending on purposes.

Next, referring to FIG. 7(b), an insulating film 108 is formed at either side of the ridge structure of the resultant shown in FIG. 7(a) for planarization. For example, the insulating film 108 is formed of $TaO_x$ or $SiO_2$. This insulating film 108 is provided for the purpose of insulating the adjacent channel layer.

Next, after applying resist on the resultant of FIG. 7(b), some portions of the resist are removed to provide 'ferromagnet-deposited portions' by use of an electron-beam lithography process. Then, an organic material which can remain after removing the portions of the resist is removed by means of oxygen plasma, and the ferromagnet-deposited portions are removed to a predetermined depth by ion-milling or dry-etching. As a result, the substrate part 100 is removed to a predetermined thickness, forming grooves 109 and 109', as shown in FIG. 7(c). The grooves 109 and 109' extend to such an extent that the bottom of each groove 109 or 109' reaches a first upper cladding 105a' or under the first upper cladding 105a'. For example, in order to obtain the structure as shown in FIG. 5(b), the grooves 109 and 109' may extend downwardly to such an extent that the bottom of each groove 109 or 109' reaches the channel layer 107.

Next, referring to FIG. 7(d), a ferromagnetic material (for example, ferromagnetic metal such as Fe, Co, Ni, CoFe, NiFe, etc. or ferromagnetic semiconductor such as (GaMn)As, (InMn)As, etc.) is deposited to form a ferromagnetic source 113, 213 or 313 and a ferromagnetic drain 114, 214 or 314. Depths of the source and the drain are varied according to the depth of the grooves 109 and 109'. For example, in the case where the bottom of each groove 109 or 109' reaches the first upper cladding layer 105a' of InGaAs, the source 113 and the drain 114 extend to the first upper cladding layer 105a (see FIGS. 4(a) and 4(b)). In the case where the bottom of each groove 109 or 109' reaches the channel layer 107, the source 213 and the drain 214 extend to the channel layer 107 (see FIGS. 5(a) and 5(b)). In the case where the bottom of each groove 109 or 109' reaches the lower upper channel layer 105, the source 313 and the drain 314 extend to the lower cladding layer 105 (see FIGS. 6(a) and 6(b)). In practice, the source and the drain are magnetized in a direction parallel to the channel for precession of the electron spins irrespective of their shapes.

After forming the source and the drain, an insulating film 110 is filled in portions, where the ferromagnetic material is not provided, to form a flat structure as shown in FIG. 7(e). Next, as shown in FIG. 7(f), a gate insulating film 116 of an oxide is formed on the substrate part, followed by depositing Al or Au to form a gate 117. As a result, a spin transistor is obtained. The gate insulating film 116 is required to prevent direct leakage of current from the gate to the semiconductor (substrate part). When forming the gate insulating film 116 or the gate 117, a patterning process is performed using photolithography.

Figure 8:
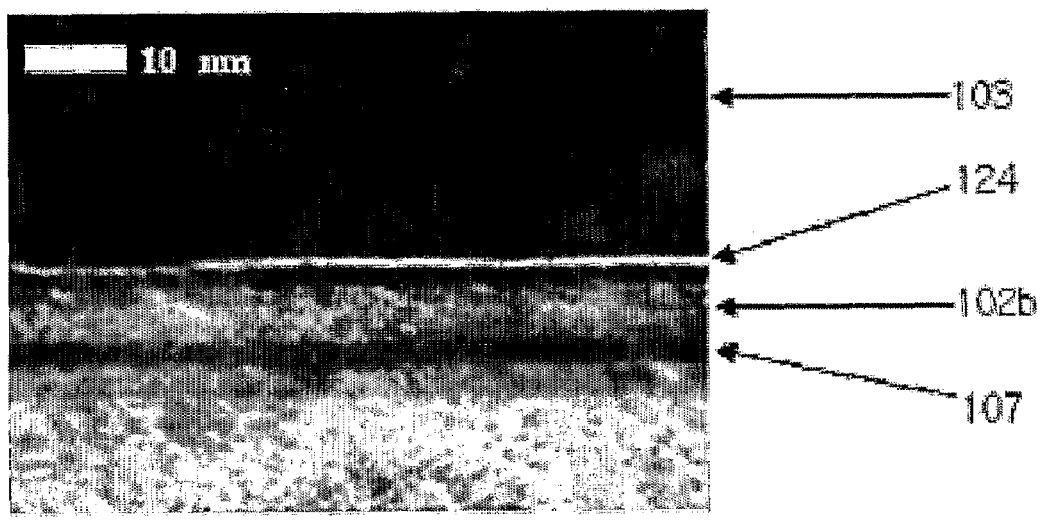
FIG. 8 is a transmission electron microscope (TEM) image showing a major cross-section of the spin transistor according to the embodiment of the present invention.

FIG. 8 is a transmission electron microscope (TEM) image showing a cross-section of a junction between a source and a substrate part. It can be understood that the cross-section shown in FIG. 8 corresponds to the embodiment shown in FIGS. 4(a) and 4(b). Referring to FIG. 8, the ferromagnetic source 113 extends to the first upper cladding layer 105a of InGaAs. A distance between the ferromagnetic source 113 and the channel layer 107 is about 7 nm. As shown in the micrograph, it can be seen that an interface between the source 113 and the semiconductor is very uniform. Although a thin oxide film 124 can be formed during the process of forming the ferromagnetic source after the ion-milling, it appears that the oxide film 124 forms a spin barrier to assist spin transfer without substantially affecting the contact resistance.

Figure 9:
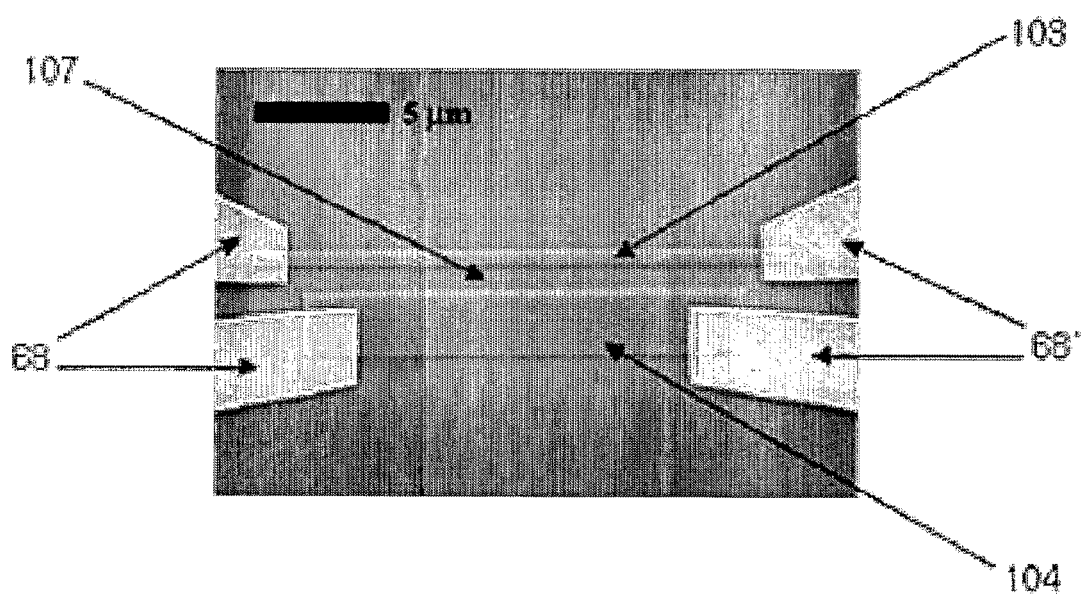
FIG. 9 is a scanning electron microscope (SEM) image showing a major cross-section of the spin transistor according to the embodiment of the present invention.

FIG. 9 is a scanning electron microscope (SEM) image showing a cross-section of a spin transistor according to one embodiment of the present invention. The spin transistor has the same cross-section as that shown in FIG. 4(b) and is formed by the process described in FIGS. 7(a) to 7(f). The source 113 and the drain 114 are formed of the ferromagnetic material, and the channel layer 107 is constituted by the two-dimensional electron gas layer. A separation between the source 113 and the drain 114 is several hundreds of nanometers to ensure transfer of spin information without any loss. The source and the drain are respectively connected with pairs of pads 68 and 68' for measurement of spin signals (non-local or local spin valve measurement) described below. Although not shown in FIG. 9, the channel layer 107 is also connected at either side with a pair of pads. For the purpose of measuring the spin transport signals only, planarization or formation of the gate electrode is omitted.

Figure 10:
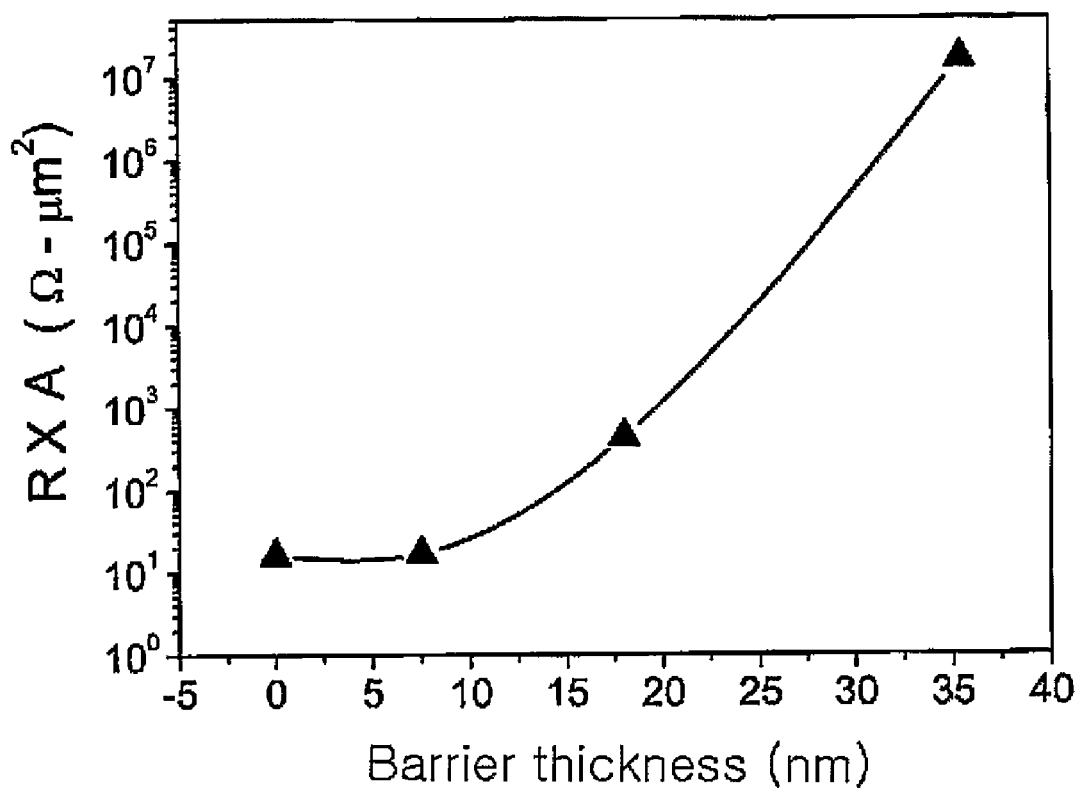
FIG. 10 is a graph depicting relationship between a thickness of a spin injection barrier and a contact resistance.

FIG. 10 is a graph depicting relationship between the thickness of the energy barrier and the contact resistance. From FIG. 10, it can be understood how the energy barrier between the ferromagnetic source and the semiconductor channel layer influences the contact resistance. The graph of FIG. 10 shows a result of measuring the contact resistance of the spin transistor which comprises the first upper cladding layer of InGaAs having a thickness of about 15 nm. In order to compare the contact resistances for the same contact area, the result of the measurement is shown by values obtained by multiplying a contact resistance (R) by a contact area (A). As shown in FIG. 10, it can seen that, when the thickness of the barrier is 15 nm or more, the contact resistance rapidly increases. This result shows that the ferromagnetic source extends downwardly below the upper surface of the substrate part and contacts the first upper cladding layer of InGaAs, so that the contact resistance can be noticeably reduced. High contact resistance acts as a source of noise upon electrical injection and detection of spin signals, and in particular, as a source of incorrect detection of the spin signals by the drain.

Inventors of the present invention carried out experiments for non-local and local spin valve measurements to find improved effect in spin transport signal and noticeably improved effect in signal sensitivity of the spin transistor according to the invention (see FIGS. 12 to 15 and 17).

Figure 11:
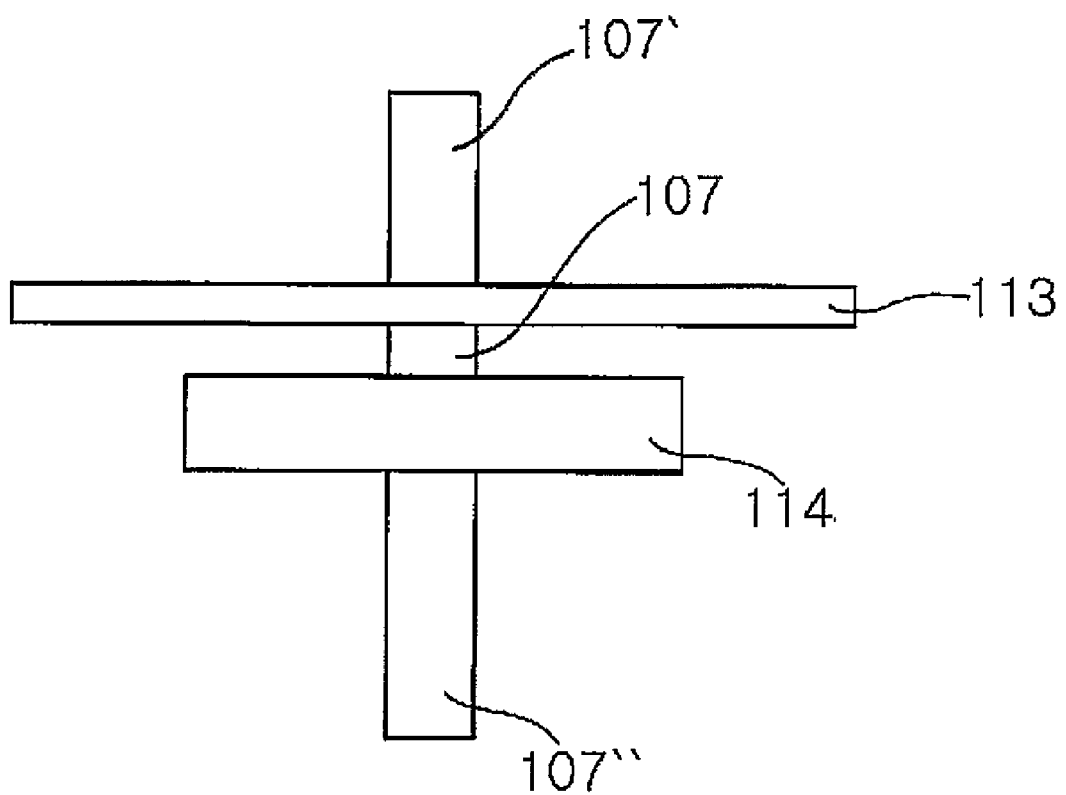
FIG. 11 is a schematic top view of a device used for non-local measurement of a spin transistor.

FIG. 11 is a schematic top view of a device used for non-local measurement for the spin transistor. Referring to FIG. 11, the spin transistor used for the non-local measurement comprises a channel layer 107 constituted by a two-dimensional electron gas layer, and a source and drain 113 and 114 spaced from each other on the channel layer 107. As for this measurement, since only injection and detection of spins in response to an applied magnetic field were performed, the transistor was not formed with a separate gate electrode. The measurement was performed using a magnetic field intentionally applied from an outside, instead of using a magnetic field generated by application of gate voltage. While current is applied to one end 107' of the channel layer 107 through the source 113, voltage between the drain 114 and the other end 107" of the channel layer 107 was measured. At this time, since the current does not flow through a voltage measuring terminal, this measurement is called the non-local measurement. In this experiment a switching field was varied by changing the size and the aspect ratio of the ferromagnetic source and drain 113 and 114. Thus, it was possible to make the magnetization direction of the source 113 parallel or anti-parallel to that of the drain 114 depending on the applied magnetic field. At this time, when the magnetization direction of the source 113 is parallel to that of the drain 114, a high voltage was observed, and on the other hand, when the magnetization direction of the source 113 is anti-parallel to that of the drain 114, a low voltage was observed. The measured voltage was divided by a bias current, and provided as a resistance. In the graph of FIG. 11, the resistance is exhibited on the y-axis, and the applied magnetic field is exhibited on the x-axis.

Figure 12:
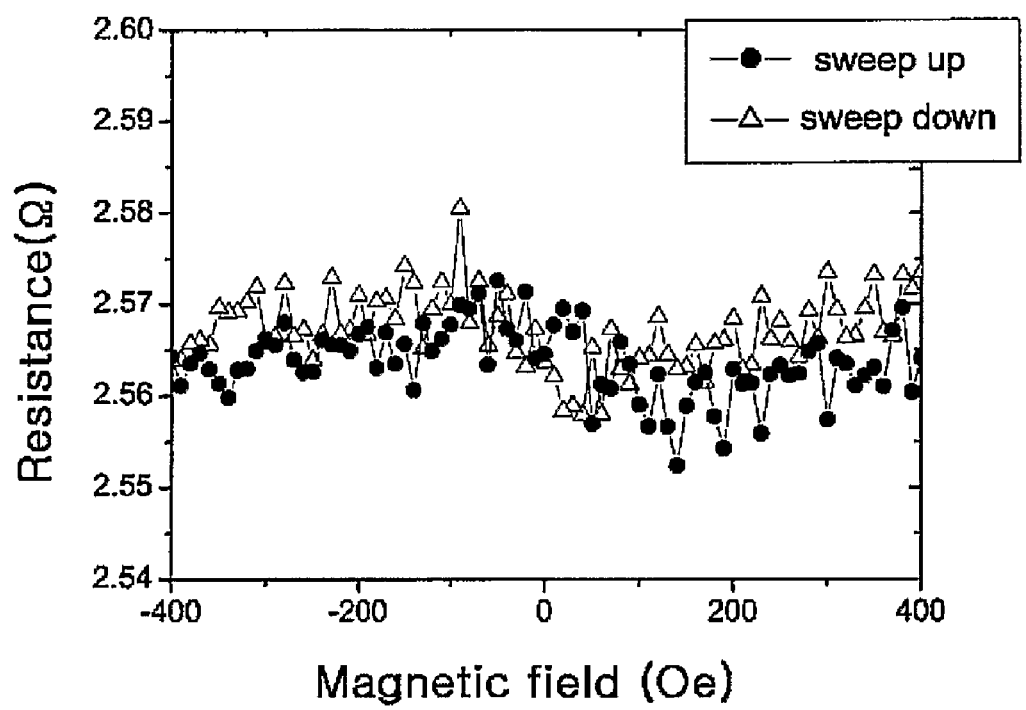
FIG. 12 is a graph depicting a result of non-local measurement for the conventional spin transistor.
Figure 13:
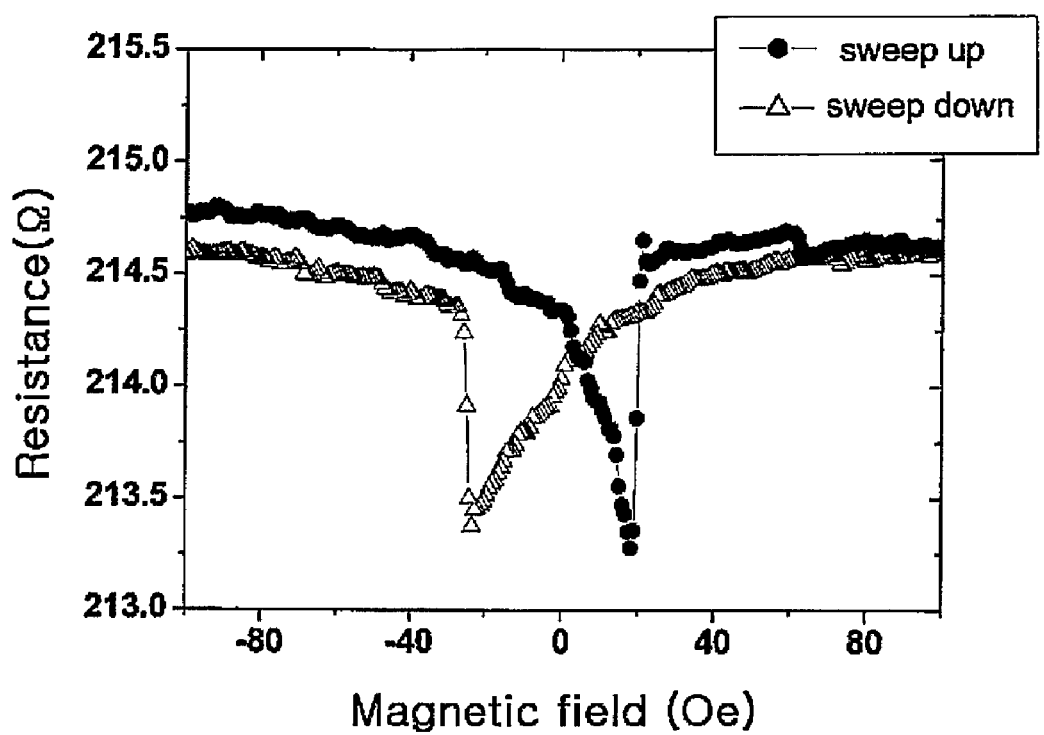
FIG. 13 is a graph depicting a result of non-local measurement for the spin transistor according to one embodiment.
Figure 14:
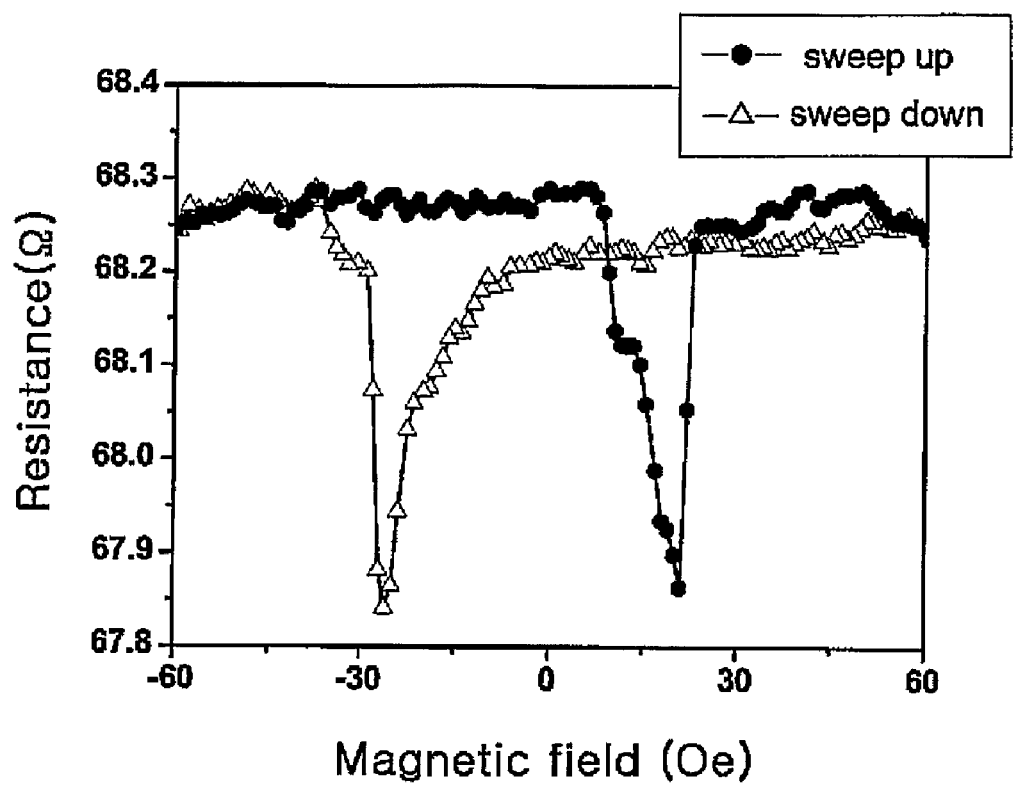
FIG. 14 is a graph depicting a result of non-local measurement for the spin transistor according to another embodiment.
Figure 15:
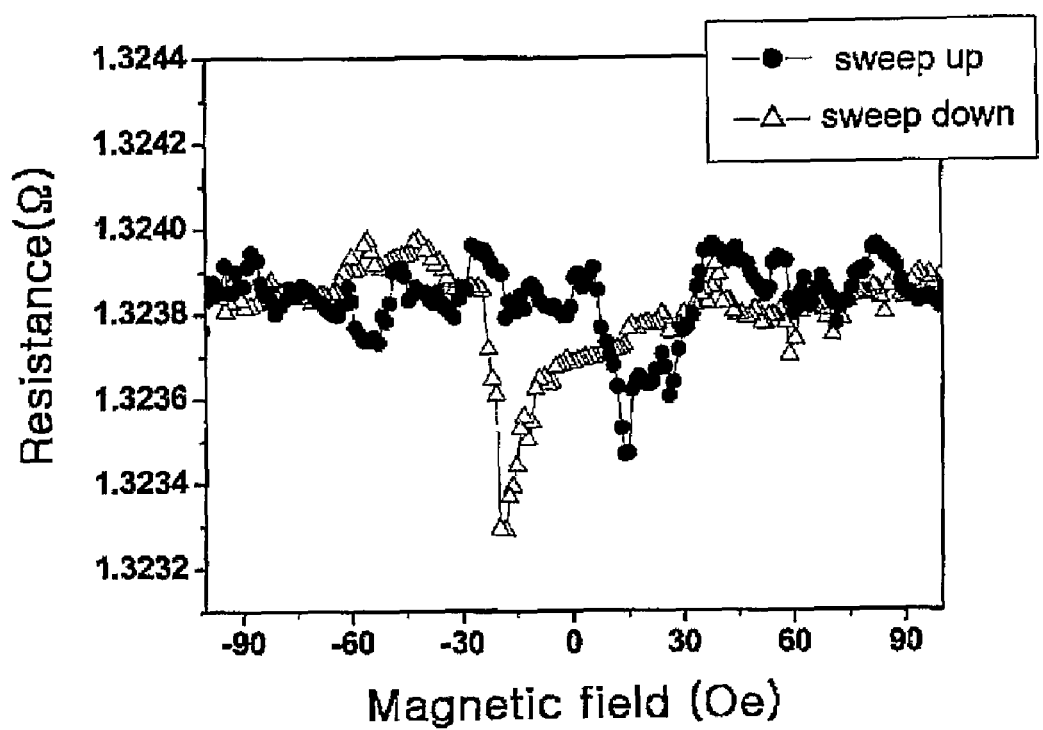
FIG. 15 is a graph depicting a result of non-local measurement of the spin transistor according to yet another embodiment.

FIGS. 12 to 15 are graphs depicting results of the non-local measurement described above. Specifically, FIG. 12 is a graph depicting a result of non-local measurement of a conventional spin transistor which has high contact resistance between ferromagnet and semiconductor. FIG. 13 is a graph depicting a result of non-local measurement of the spin transistor as shown in FIG. 4(b), FIG. 14 is a graph depicting a result of non-local measurement of the spin transistor as shown in FIG. 5(b), and FIG. 15 is a graph depicting a result of non-local measurement (at different temperature) of the spin transistor as shown in FIG. 5(b). FIGS. 12 to 14 show the results of the non-local measurements at a temperature of about 16 k, and FIG. 15 shows the result of the non-local measurement at room temperature. Although not shown in the drawings, a result of non-local measurement of the spin transistor as shown in FIG. 6(b), it is similar to that of FIG. 14.

In FIGS. 12 to 15, the first upper cladding layer of InGaAs has a thickness of about 15 nm. For the transistor used for the measurement of FIG. 12, the energy barrier has a thickness of about 21.5 nm (thus, it is necessary for the spin electrons to surmount the energy barrier of the second upper cladding layer). For the transistor of FIG. 13, the energy barrier has a thickness of 7 nm. For the transistors of FIGS. 14 and 15, the ferromagnetic source contacts the channel layer.

In the respective graphs of FIGS. 12 to 15, the term "sweep up" means the case where the voltage is measured while increasing the magnetic field, and the term "sweep down" means the case where the voltage is measured while decreasing the magnetic field. Since the ferromagnet exhibits hysteresis properties, the measurement result in the sweep up condition is not identical to the measurement result in the sweep down condition.

Referring to FIG. 12, it can be found that the resistance of the transistor in response to the applied magnetic field does not show clear spin signals. That is, when the thickness of the energy barrier is about 21.5 nm, a base line resistance is high and a high degree of noise due to the energy barrier of the second upper cladding layer, thereby failing to provide clear spin signals.

However, when the thickness of the barrier is in the range of 0~10 nm, the clear spin signals are observed as shown in FIGS. 13 and 14. In FIGS. 13 and 14, it is possible to clearly find a dip section (in the graph) which shows the magnetic field is in a anti-parallel state between 20~30 Oe. Even in the case where the ferromagnetic source extends to the second lower cladding layer beyond the channel layer (see FIG. 6(b); even in this case, the thickness of the barrier is substantially 0), the transistor shows characteristics similar to those shown by the graph of FIG. 14. In particular case of FIG. 5(b), even at room temperature, the transistor shows clear spin signals as shown in FIG. 15.

Figure 16:
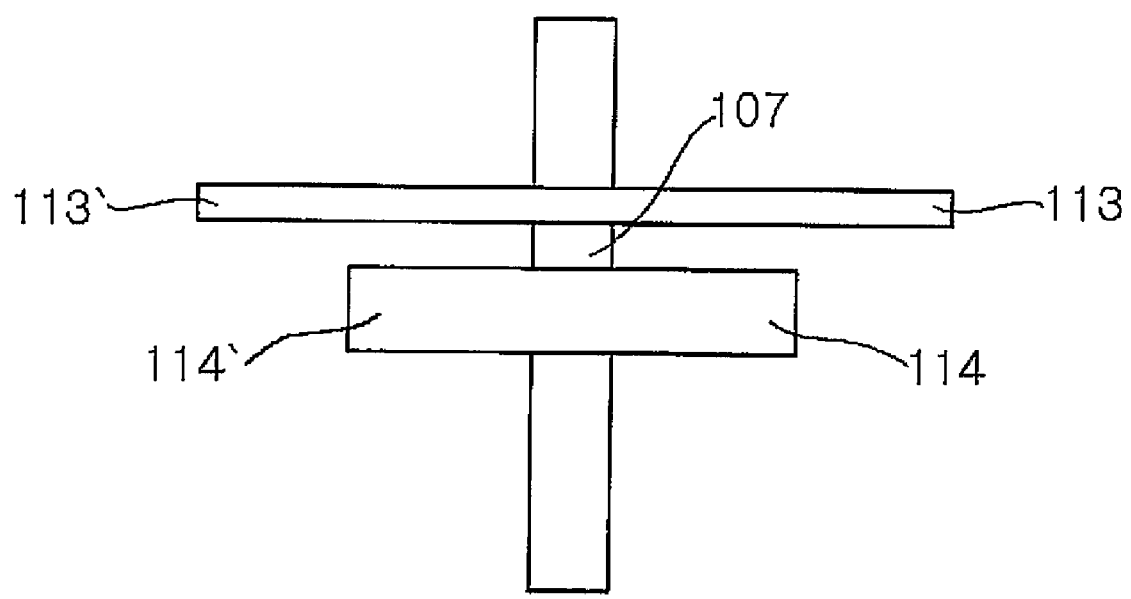
FIG. 16 is a schematic top view of a device used for local spin valve measurement for a spin transistor.

FIG. 16 is a schematic top view of a device used for local spin valve measurement of a spin transistor.

In FIG. 16, the local spin valve measurement was performed in such a way that, while current was applied between the source 113 and the drain 114, voltage between one end 113' of the source 113 and one end 114' of the drain 114 was measured. That is, the local spin valve measurement is a method of measuring the resistance between the source and the drain. For the local spin valve measurement, when the magnetization of the source was parallel to the magnetizaton of the drain, the resistance was low (that is, low measured resistance), and when the magnetization of the source was anti-parallel to the magnetization of the drain, the resistance was high (that is, high measured resistance) unlike the non-local measurement. Since the local spin valve measurement was performed using the same operating method as that of the spin transistor, it could be considered that actual operation of a prototype spin transistor was precisely evaluated by this measurement.

Figure 17:
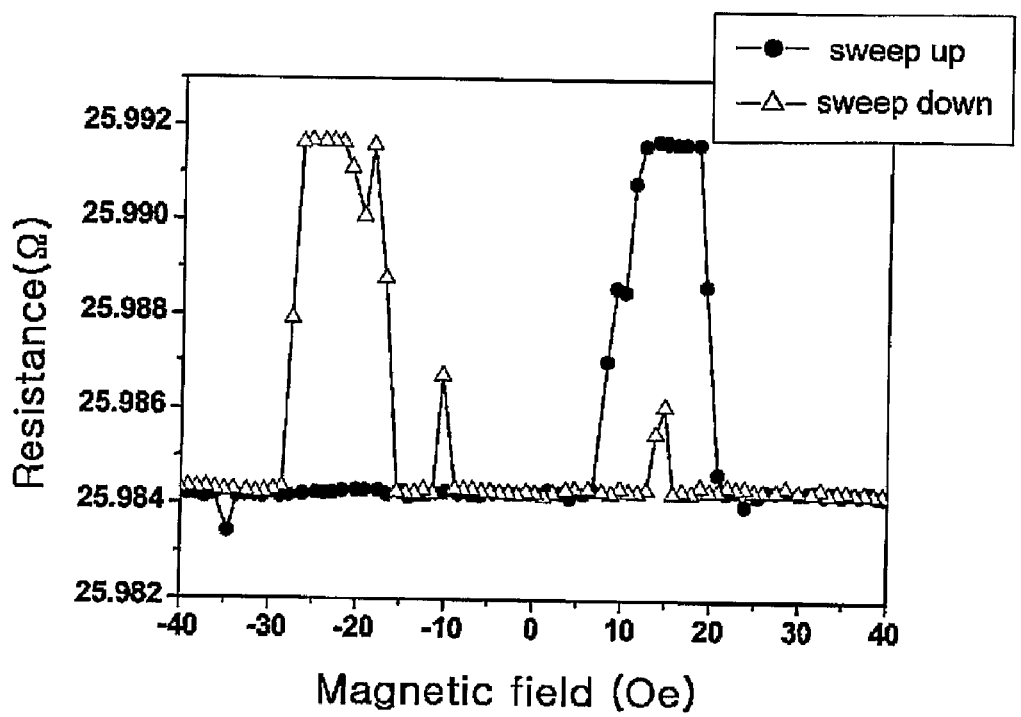
FIG. 17 is a graph depicting a result of local spin valve measurement for the spin transistor according to one embodiment.

FIG. 17 is a graph depicting a result of local spin valve measurement (at a temperature of 16 K) of the spin transistor of FIG. 4(b) (in which the ferromagnetic source extends to the first upper cladding layer of InGaAs). In FIG. 17, not only a noticeable increase in resistance is shown, but also a plateau of high resistance is clearly observed in the anti-parallel state between the source and the drain. Therefore, with the structure shown in FIG. 4(b), it is possible to obtain not only clear spin signals but also a wide reading margin upon application of the spin transistor.

It should be understood that the embodiments and the accompanying drawings have been described for illustrative purposes and the present invention is limited only by the following claims. Further, those skilled in the art will appreciate that various modifications, additions, and substitutions are allowed without departing from the scope and spirit of the invention as set forth in the accompanying claims.

We claim:

1. A spin transistor, comprising:
   a semiconductor substrate part having a lower cladding layer, a channel layer, and an upper cladding layer sequentially stacked therein;
   a ferromagnetic source and drain spaced from each other on the substrate part; and
   a gate formed on the substrate part to control spins of electrons passing through the channel layer,
   wherein the lower cladding layer comprises a first lower cladding layer and a second lower cladding layer formed under the first lower cladding layer and having a higher band gap than that of the first lower cladding layer,
   wherein the upper cladding layer comprises a first upper cladding layer and a second upper cladding layer formed on the first upper cladding layer and having a higher band gap than that of the first upper cladding layer, and
   wherein the source and the drain are buried in an upper surface of the substrate part and extend downwardly to or under the first upper cladding layer.

2. The spin transistor according to claim 1, wherein the source and the drain have lower surfaces extending to the first upper cladding layer.

3. The spin transistor according to claim 1, wherein the source and the drain have lower surfaces extending to the channel layer.

4. The spin transistor according to claim 1, wherein the source and the drain have lower surfaces extending to the lower cladding layer.

5. The spin transistor according to claim 1, wherein the channel layer comprises a two-dimensional electron gas layer.

6. The spin transistor according to claim 5, wherein the two-dimensional electron gas layer is formed of a material selected from the group consisting of GaAs, InAs, InGaAs and InSb.

7. The spin transistor according to claim 1, wherein the source and the drain are ferromagnetic metal.

8. The spin transistor according to claim 7, wherein the source and the drain are formed of a material selected from the group consisting of Fe, Co, Ni, CoFe, NiFe and combination thereof.

9. The spin transistor according to claim 1, wherein the source and the drain are ferromagnetic semiconductor.

10. The spin transistor according to claim 9, wherein the source and the drain are formed of one of (GaMn)As and (InMn)As.

11. The spin transistor according to claim 1, wherein the substrate part further comprises a carrier supply layer formed under the lower cladding layer.

12. The spin transistor according to claim 11, wherein the carrier supply layer is formed of n-doped InAlAs.

13. The spin transistor according to claim 1, wherein the substrate part further comprises a capping layer formed on the upper cladding layer.

14. The spin transistor according to claim 13, wherein the capping layer is formed of InAs.

15. The spin transistor according to claim 1, wherein the first upper and lower cladding layers are formed of un-doped InGaAs, and the second upper and lower cladding layers are formed of un-doped InAlAs.

16. The spin transistor according to claim 1, further comprising:
   a natural oxide film at an interface between the substrate part and the lower surface of each of the source and the drain.

* * * * *